(12) United States Patent
Van Uden

(10) Patent No.: US 7,554,831 B2
(45) Date of Patent: Jun. 30, 2009

(54) INTEGRATED CIRCUIT DEVICE WITH A ROM MATRIX

(75) Inventor: Albertus Jan Paulus Maria Van Uden, Eindhoven (NL)

(73) Assignee: NXP B.V., Eindhoven (NL)

( * ) Notice: Subject to any disclaimer, the term of this patent is extended or adjusted under 35 U.S.C. 154(b) by 434 days.

(21) Appl. No.: 10/587,646

(22) PCT Filed: Jan. 18, 2005

(86) PCT No.: PCT/IB2005/050207

§ 371 (c)(1),
(2), (4) Date: Jul. 27, 2006

(87) PCT Pub. No.: WO2005/073982

PCT Pub. Date: Aug. 11, 2005

(65) Prior Publication Data

US 2009/0016145 A1     Jan. 15, 2009

(30) Foreign Application Priority Data

Jan. 28, 2004   (EP) ................................. 04100300

(51) Int. Cl.
*G11C 11/00* (2006.01)
(52) U.S. Cl. ........................................ 365/94; 365/205
(58) Field of Classification Search .................... 365/94, 365/205

See application file for complete search history.

(56) References Cited

U.S. PATENT DOCUMENTS 4,612,629 A * 9/1986 Harari ................... 365/185.08
5,461,713 A    10/1995 Pascucci
5,930,180 A    7/1999 Callahan
6,538,914 B1 * 3/2003 Chung ......................... 365/145
2003/0218920 A1 * 11/2003 Harari ........................ 365/200
2004/0159870 A1 * 8/2004 Ishiguro ..................... 257/296

FOREIGN PATENT DOCUMENTS

EP          0 570 708          11/1993

OTHER PUBLICATIONS

Takahashi O et al: "A 1-GHZ Logic Circuit Family With Sense Amplifiers"; IEEE Journal of Solid-State Circuits; IEEE Inc N.Y. US; vol. 34 No. 5; May 1999; pp. 616-622.

* cited by examiner

*Primary Examiner*—Michael T Tran

(57) ABSTRACT

A read only memory matrix in an integrated circuit contains data transistors coupled to both the bit lines and the word lines in data dependent ones of the cells of the matrix. A differential sense amplifier has a first input coupled to a bit line, a second input coupled to a reference circuit and a control input for controlling activation and deactivation of amplification by the sense amplifier. A coupling circuit controllably permits charge sharing between a selectable one of the bit lines and the first input. A timing circuit is arranged to signal operation in a first phase, when the word lines have selected a row of the matrix, followed by a second phase. The timing circuit controls the coupling circuit to permit charge sharing between the input and the selectable one of the bit lines in the first phase. In the second phase the timing circuit controls the coupling circuit to prevent charge sharing, makes the reference circuit deactivate driving the reference voltage, and subsequently activates amplification by the differential sense amplifier. Preferably the timing circuit contains a dummy bit line and a trigger circuit for triggering the second phase when a potential swing on the dummy bit line exceeds a threshold value.

19 Claims, 4 Drawing Sheets

INTEGRATED CIRCUIT DEVICE WITH A ROM MATRIX

Figure 1:
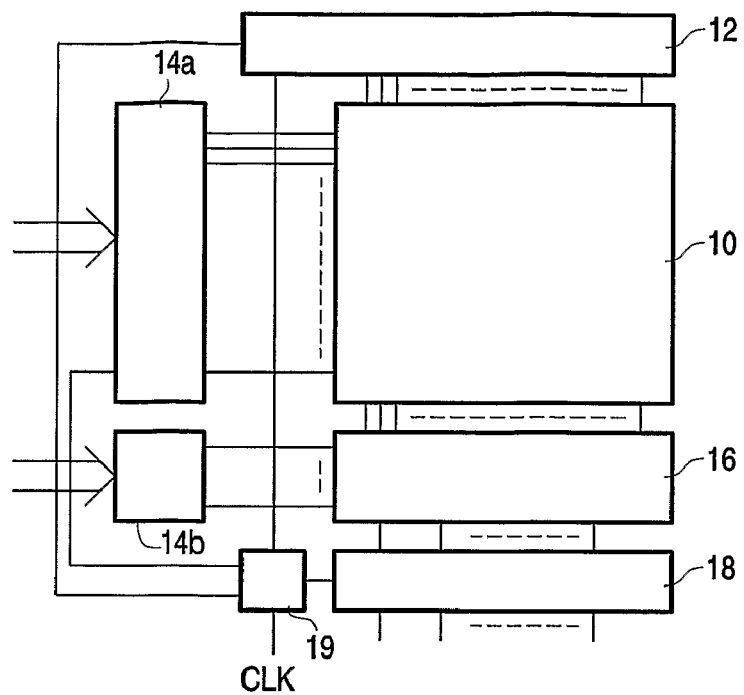

The invention relates to an integrated circuit device with a ROM (Read Only Memory) matrix.

U.S. Pat. No. 5,930,180 discloses a ROM (Read Only Memory) matrix with a sense amplifier that contains a pair of cross coupled inverters. The input of one of the inverters is coupled to a bit line and the input of the other inverter is coupled to a reference bit line. The pair of cross coupled inverters acts as a differential sense amplifier, which eventually assumes one logical state or another, dependent on the values of the voltages on the bit line and the reference bit line when the inverters are activated.

Differential sensing has obvious advantages in terms of speed and sensitivity, which translates into the capacity to work with a large ROM matrix. However, for reliable differential sensing of single ended signals a reference signal is required. This is the case in conventional ROMs, in which each data bit is represented by the absence or presence of a single circuit connection that determines whether or not a memory cell pulls down the voltage on a bit line if the memory cell is selected.

U.S. Pat. No. 5,930,180 uses a reference bit line to generate the reference signal. One reference bit line is provided for a plurality of normal bit lines. In ROMs the speed of initial signal development on the bit lines depends much more heavily on unselected data than in DRAMs or SRAMs. The data in unselected memory cells, which is expressed by the absence or presence of circuit connections to the bit lines and/or the word lines, affects the capacitive load on the bit lines and/or word lines. Thus, different bit lines will have different capacitive load value. The reference bit line, which has to serve as a reference for any selected bit line, can only provide one capacitive load value. As a result careful matching is needed to ensure that the voltage on the reference bit line can be used to distinguish between different data values. This leaves a small margin of error. However, the voltage on the reference bit line can easily be disturbed by interference. Moreover the reference bit line takes up place in the integrated circuit and its operation consumes power.

Among others, it is an object of the invention to provide for an integrated circuit device that contains a read only memory matrix with a differential sense amplifier in which no capacitance balancing is needed between the bit line that is coupled to one differential input of the sense amplifier and a reference circuit coupled to another differential input.

Among others, it is an object of the invention to provide for an integrated circuit device that contains a read only memory matrix with a differential sense amplifier in which no reference bit line is needed that supplies a reference voltage to the differential sense amplifier.

The invention provides for an integrated circuit device according to claim 1. The device contains a read only memory with a differential sense amplifier. The sense amplifier is used in a two phase read out process, wherein first a charge sharing connection is established between a selected bit line and a first input node of the sense amplifier and in a second phase the charge sharing connection is severed and amplification of the sense amplifier is activated. A reference circuit drives a reference voltage to a second input node of the sense amplifier, but driving is interrupted in the second phase. Thus the sense amplifier amplifies only once its inputs are no longer coupled to the bit line and driven by the reference circuit. As a result no capacitance balancing between the bit line and the reference circuit is needed. Therefore, the reference circuit may be included in the periphery of the memory matrix, without using a reference bit line that extends along the entire memory matrix in parallel with the bit lines.

The timing circuit preferably comprises a dummy bit line that generates a dummy bit signal with the slowest possible signal development that may occur on any bit line. The timing circuit is arranged to switch to the second phase only when this dummy bit signal reaches a threshold, that has been selected so that it is ensured that the potential on any active bit line will have crossed the reference voltage when the dummy bit signal reaches the threshold.

In an embodiment the differential sense amplifier has a first and second switching circuit coupled between the sense amplifier and the first and second power supply connection respectively, the timing circuit deactivating and activating amplification by the sense amplifier by making both switching circuits non-conductive and conductive respectively. Thus the sense amplifier cannot amplify any signals as long as the bit line is coupled to the sense amplifier. The sense amplifier may comprise a pair of cross coupled inverters for example, such a positive feedback circuit will eventually assume one of two defined states dependent on the charge received from the bit line.

Figure 1A:
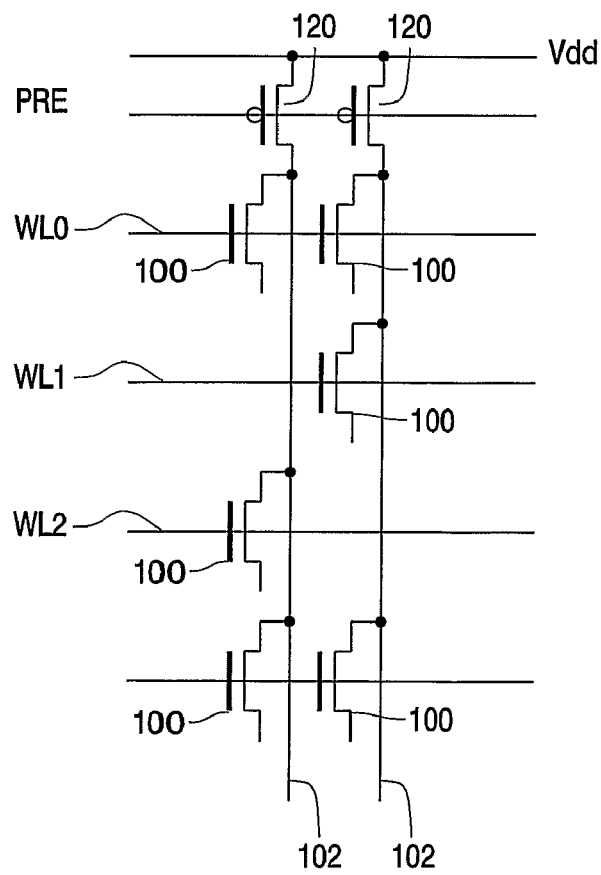
Figure 1B:
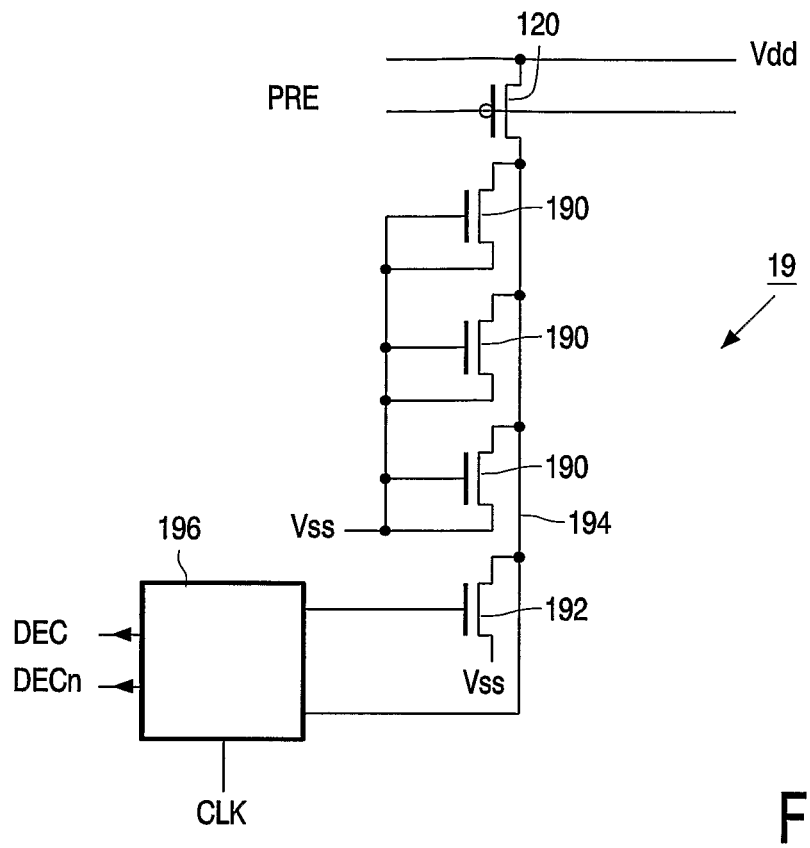
Figure 2:
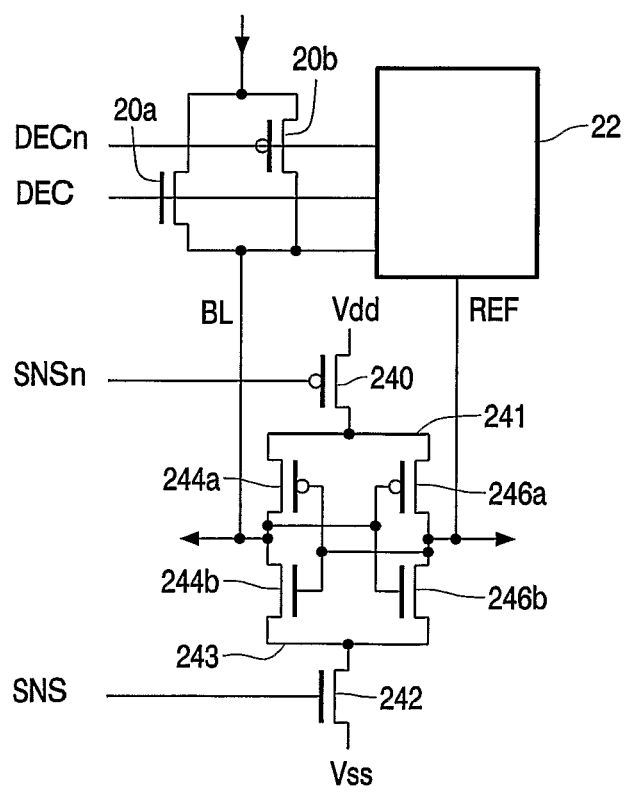
Figure 3:
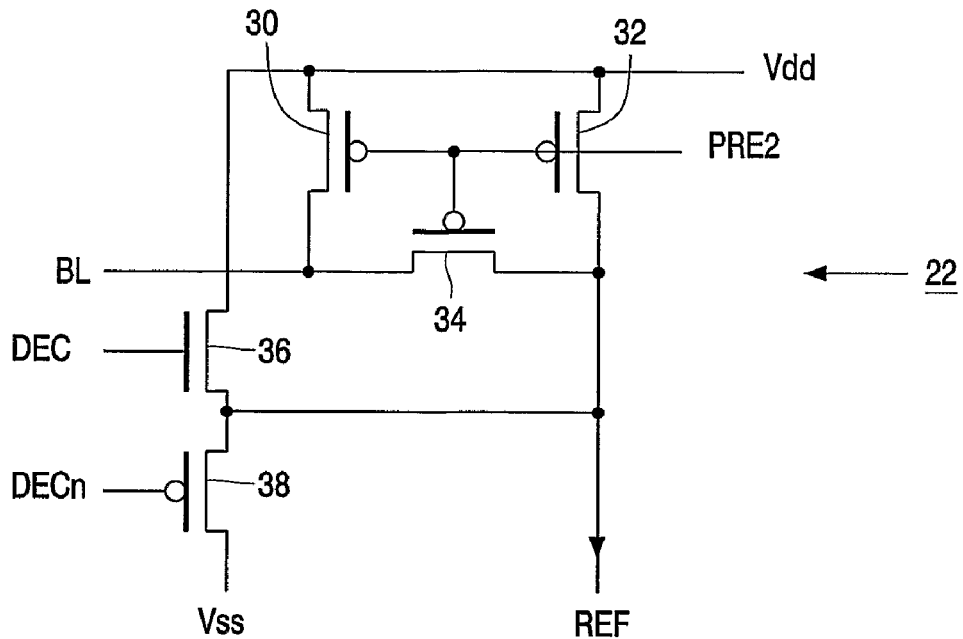
Figure 3A:
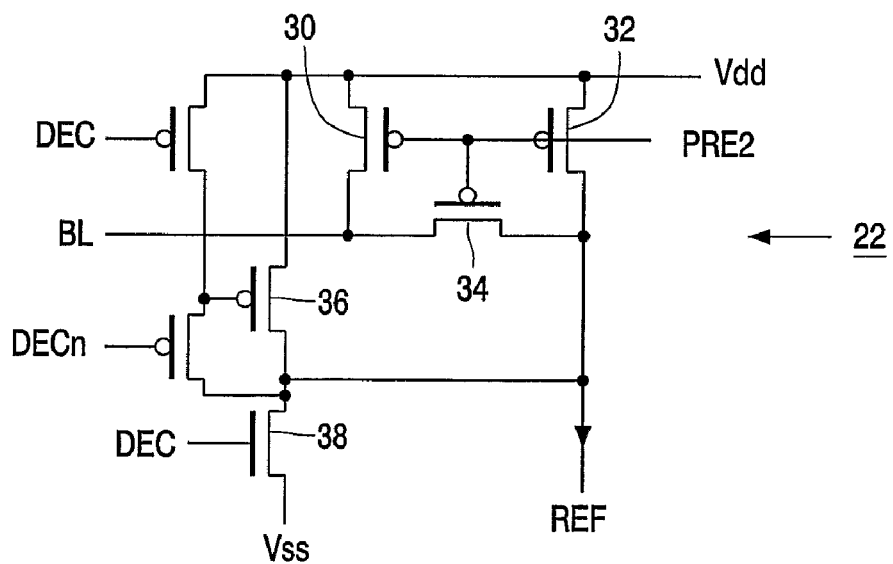
Figure 4:
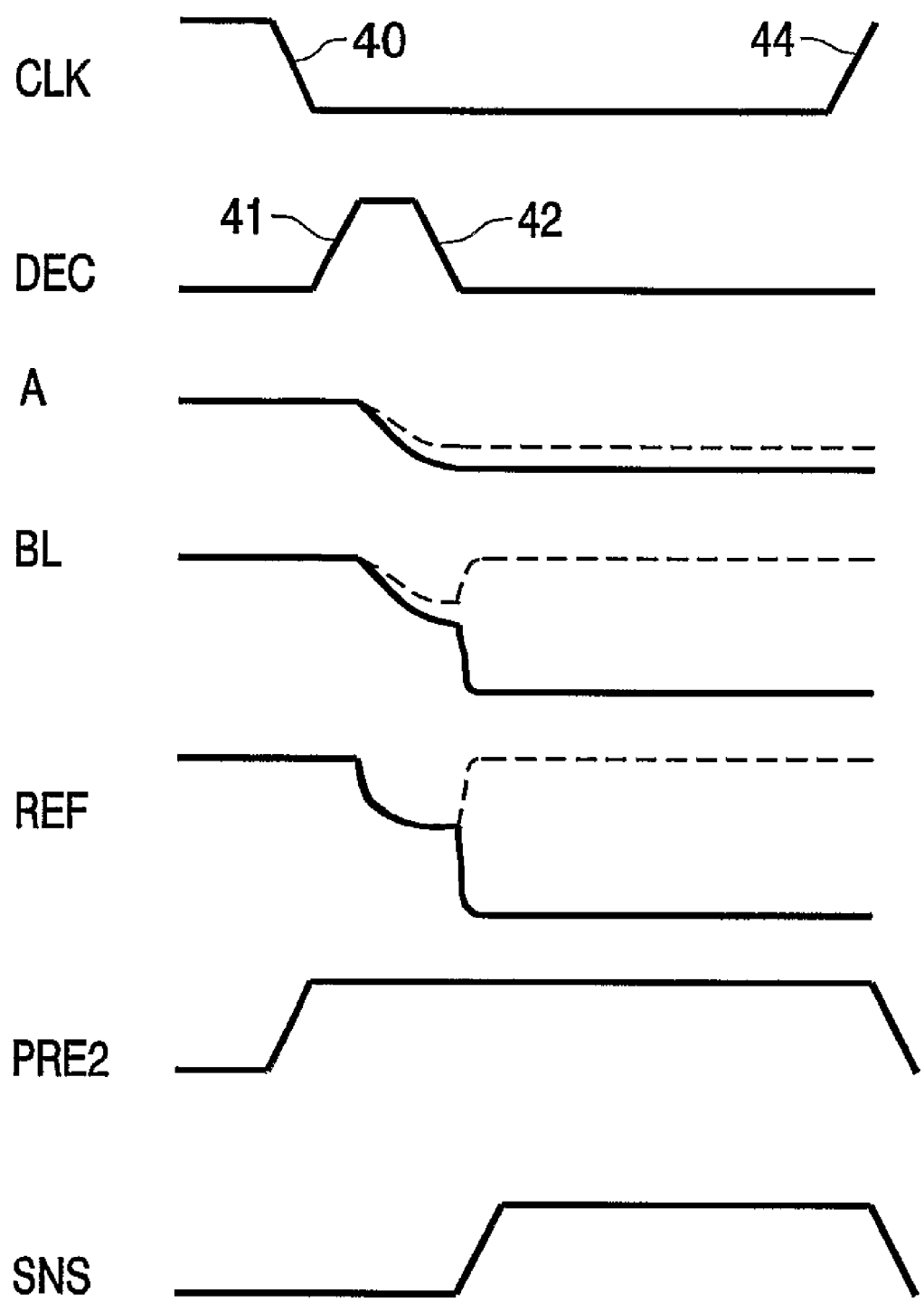

These and other objects and advantageous aspects of the invention will be described by way of example using the following figures FIG. 1 shows a read only memory circuit FIG. 1a shows two bit-lines FIG. 1b shows a timing circuit FIG. 2 shows a sense amplifier FIG. 3 shows a reference circuit FIG. 3a shows an alternative reference circuit FIG. 4 shows timing signals FIG. 1 shows a read only memory circuit, comprising a memory matrix 10, a column precharge circuit 12, an addressing circuit 14a, 14b, a column multiplexer 16, sense amplifiers 18, and a timing circuit 19.

FIG. 1a shows part of memory matrix 10 and precharge circuit 12 in more detail. The memory matrix is organized in rows and columns. The memory matrix comprises a plurality of bit lines 102 (only two shown), each corresponding to a respective column. The precharge circuit comprises precharge transistors 120 each with a main current channel coupled between a respective bit line 102 and a first power supply connection Vdd. The control electrodes of precharge transistors 120 are connected together and to a precharge input.

The memory matrix comprises a plurality of word lines WL0, WL1, WL2 . . . , each corresponding to a respective one of the rows. Each cross point of a bit line 102, and a word line WL0, WL1, WL2, . . . corresponds to a memory cell. Data is represented by the presence or absence of data transistors 100, with a main current channel coupled between the bit line 102 and a second power supply connection (Vss not shown explicitly). The control electrodes of each particular data transistor 100 is coupled to the word line WL0, WL1, WL2, . . . of the row to which the particular data transistor 100 belongs. By way of example a first bit line 102 is connected to data transistors 100 that have control electrodes coupled to word lines WL0, WL2, etc. but not to a data transistor 100 that has a control electrode coupled to word line WL1. A second bit line 102 has no data transistor 100 that has a control electrode coupled to word line WL1. It will be appreciated that the data that is stored determines exactly which bit lines are coupled to data transistors 100 that are connected to respective word lines WL0, WL1, WL2 . . . in memory matrix 10.

FIG. 1b shows an example of a timing circuit 19. Part of this timing circuit geographically forms part of memory matrix 10. This part contains a dummy bit line 194, connected to the first power supply connection Vdd via the main current channel of one of the precharge transistors 120 of precharge circuit 12. At the positions that correspond to rows reference transistors 190 are coupled to dummy bit line 194. Reference transistors 190 are identical to the data transistors of memory matrix 10, however, their control electrodes are coupled to the second power supply connection Vss, so that the main current channels of reference transistors 190 are non conductive.

The timing circuit also contains a pulse generator circuit 196 and a dummy data transistor 192. Dummy data transistor 192 is coupled to dummy bit line similarly to the data transistors of memory matrix 10, but its control electrode is driven by pulse generator 196. Dummy bit line 194 is coupled to an input of pulse generator 196.

The timing circuit is arranged to generate pulses with a width that corresponds to a worst case time needed to lower the potential of any of the bit lines 102 where one data transistor 100 conducts below a threshold voltage. This realized by applying a signal transitions at the start of a pulse to the control electrode of dummy data transistor 192 and using the resulting voltage change on dummy bit line 194 to terminate the pulse. A conventional inverter circuit, with an input coupled to dummy bit line 194 may be used to signal when to end the pulse for example. To ensure sufficient width dummy bit line 194 preferably is capacitively loaded with the maximum number of transistors (reference transistors 190 and dummy data transistor 192) that can load a real bit line (one for each row), however, it should be appreciated that small deviations from this number do not significantly affect the timing circuit.

Preferably, timing circuit 19 also contains a structure that affects transfer of the voltage from dummy bit line to the thresholding in the same way as column multiplexer 16 does for the bit lines.

Addressing circuit 14a, 14b comprises a row selector 14a, which receives a first part of a memory address and has outputs coupled word lines WL0, WL1, WL2 . . . . Furthermore, addressing circuit 14a, 14b comprises a column multiplexer 16 which couples a set of selected bit lines to sense amplifiers 18, selected under control of a second part of the memory address.

FIG. 2 shows a sense amplifier circuit. At the heart of the sense amplifier is a pair of inverter circuits (244a, 244b), (246a, 246b) with cross-coupled inputs and outputs and with interruptible power supply connections to both the first and the second power supply connection Vdd, Vss.

A first power supply transistor 240 has a main current channel coupled between the first power supply Vdd and a first node 241. Each comprising a series connection of the main current channel of a PMOS transistor 244a, 246a, and an NMOS transistor 244b, 246b, both coupled between the first node 241 and a second node 243. The second node 243 is coupled to the second power supply Vdd via the main current channel of a second power supply transistor 242. The control electrodes of the PMOS transistor 244a, 246a and the NMOS transistor 244b, 246b of each series connection are coupled to each other and to a node between the main current channels of the transistors of the other series connection.

The sense amplifier circuit contains an NMOS transistor 20a and a PMOS transistor 20b with their main current channels coupled in parallel between an output of column multiplexer 16 and an internal bit line part BL, which is coupled to the input of a first one (246a, 246b) of the pair of inverters. Furthermore the sense amplifier circuit contains a reference circuit 22 with an output REF coupled to the input of a second one (244a, 244b) of the pair of inverters.

FIG. 3 shows an embodiment of reference circuit 22. This reference circuit contains equalization transistors 30, 32, 34 with main current channels coupled between internal bit line part BL and the first power supply connection Vdd, internal bit line part BL and the reference output REF, and the reference output REF and the first power supply connection Vdd respectively. The control electrodes of the equalization transistors are coupled together. Furthermore, reference circuit 22 comprises an NMOS bias transistor 36 and a PMOS bias transistor 38, having main current channels coupled between the reference output REF and the first power supply connection Vdd and the reference output REF and the second power supply connection Vss respectively.

FIG. 4 will be used to illustrate the operation of the read only memory circuit. Operation is initiated by processing circuits (not shown) that supply addresses to the address inputs of addressing circuits 14a, 14b and read data from sense amplifiers 18, synchronizing their operation with that of the memory circuit by means of a clock signal CLK. Operation of the memory circuit starts upon reception of a transition 40 in the clock signal CLK that is supplied to timing circuit 19.

Prior to transition 40 the memory is in a preliminary phase of operation. In this phase precharge transistors 120 in precharge circuit 12 couple the bit lines to the first power supply connection, so that their potential is drawn to Vdd. NMOS transistor 20a and a PMOS transistor 20b are non conductive. Equalization transistors 30, 32, 34 are conductive, so that the potentials on internal bit line part BL and reference output REF are equalized and drawn to Vdd. First and second power supply transistors 240, 242 are non-conductive.

Transition 40 triggers a first phase of operation of the memory. In response to transition 40 in a clock signal CLK timing circuit 19 generates a first transition 41 in a decode signal DEC and its logic complement DECn. DEC is supplied to precharge circuit 12 to cause the main current channels of precharge transistors 120 to become non-conductive in the first phase. With a slight delay with respect to DEC, a signal DEC' generated by timing circuit 19 causes row selector 14a to raise the voltage on an addressed one of the word lines WL0, WL1, WL2, . . . .

As a result the voltage on the bit lines 102 that contain a data transistor 100 in the selected row (as indicated by the word lines) will be pulled down by the relevant data transistors 100. This is illustrated by the solid line in the signal A of the figure. The voltage on the bit lines 102 that do not contain a data transistor 100 in the selected row generally also drops, due to leakage currents, but more slowly than if a data transistor 100 is present. This is illustrated by the dashed line in signal A of the figure.

Column multiplexer 16 conductively couples selected ones of the bit lines to sense amplifiers 1. In the sense amplifiers 1 equalization transistors 30, 32, 34 are made non conductive in the first phase upon transition 40 of the clock signal CLK. Under control of the DEC and DECn signals NMOS transistor 20a and PMOS transistor 20b are made conductive. As a result the selected bit lines 102 share charge with the internal bit line parts BL. Therefore the potential of the internal bit line part BL follows the potential of a selected bit line 102 in the first phase.

In the first phase NMOS and PMOS bias transistors 36, 38 are made conductive under control of DEC and DECn. As a result the reference output REF assumes a potential determined by these bias transistors. This potential is roughly one threshold voltage VTn of NMOS bias transistor 36 below the potential of the first power supply connection Vdd. Because the source of NMOS bias transistor 36 is not at Vdd potential the threshold VTn is higher than for normal NMOS transistors of the integrated circuit, that have their source connected to Vdd. Bias transistors 36, 38 are dimensioned so that the voltage at the reference output REF is higher than the threshold voltage at dummy bit line 194 at which timing circuit 19 cuts off the DEC pulse. Thus, it is ensured that the potential on even the most loaded bit line that is pulled down by a data transistor 100 will have dropped below the reference voltage at the end of the DEC pulse. It should be noted that the speed with which the reference output REF assumes its reference level is generally much faster than the speed of potential change of bit line part BL, because reference output REF is not loaded by a bit line to which many data transistors may be connected and because the control electrodes of bias transistors 36, 38 are driven directly by DEC and DECn.

A second phase of operation starts in response to a second transition 42 in the decode signal DEC. Timing circuit 19 generates second transition 42 with a delay after first transition 41. The delay is determined by the time interval needed to discharge dummy bit line 194 so that the potential of dummy bit line 194 drops below a threshold value. Because of the construction of timing circuit 19 it is ensured that this time interval is larger than the time interval needed by any of the bit lines 102 to reach the threshold value if a selected data transistor 100 is connect to that bit line 102.

In the second phase the conductive connection between the selected bit lines 102 and the bit line parts BL is severed (by making pass transistors 20a,b non-conductive) and the bias transistors 36, 38 are made non-conductive. Subsequently first and second internal power supply nodes 241, 243 of the cross coupled inverters (244a, 244b), (246a,246b) of the sense amplifiers are coupled to the power supply connections Vdd, Vss.

As a result the cross coupled inverters (244a, 244b), (246a, 246b) amplify any potential difference between their inputs, i.e. bit line part BL and reference output REF until a state is assumed wherein one inverter has a logic low input and the other a logic high. These logic levels are used as output signals. These levels may be latched into a latch circuit (not shown; e.g. a pair of NAND gates, each with a first input coupled to the output of a respective one of the inverters and a second input coupled to the output of the other NAND gate). From this latch circuit the data is supplied to the processing circuits (not shown for further use).

Once that data has been latched the circuit is ready for a next cycle. This cycle may be started by another transition 44 in clock signal CLK, upon which the circuit returns to the preliminary phase of operation.

Thus, by preventing that the sense amplifier provides active amplification while a selected bit line shares charge with internal bit line part BL, and severing the connection between the selected bit line 102 and the internal bit line part BL prior to active amplification it, is made possible that a differential sense amplifier can be used with a reference circuit that does not need to have capacitive characteristics similar to those of the bit lines. In particular, a reference circuit can be used that does not contain a dummy bit line that extends in parallel with the bit lines of memory matrix 10 to provide a reference voltage. Thus, potential interference problems due to the such a dummy bit line are eliminated, and space and power consumption for generating the reference voltage are reduced.

Because the reference circuit doe requires only a few transistors, the reference circuit does not significantly suffer from leakage currents. This makes it easier to ensure a proper reference level.

FIG. 3a shows an alternative embodiment of reference circuit 22. Compared to FIG. 3, in this embodiment bias transistors 36, 38 have been replaced by an alternative bias circuit, containing a PMOS bias transistor 360, an NMOS bias transistor 380, and a first and second PMOS control transistor 390, 395. Reference output REF is coupled to first power supply connection Vdd via the main current channel of PMOS bias transistor 360 and to second power supply connection Vss via the main current channel of NMOS bias transistor 380. The main current channel of first control transistor 390 is coupled between reference output REF and the control electrode of PMOS bias transistor 380. The control electrode of first control transistor 390 receives DECn. The main current channel of second control transistor 390 is coupled between the control electrode of PMOS bias transistor 380 and first power supply connection Vdd. The control electrode of second control transistor 390 receives DEC.

In operation, in the first phase NMOS bias transistor 380 is made conductive under control of DEC. First PMOS control transistor 390 is made conductive as well. As a result, PMOS bias transistor 360 operates as a diode, the circuit generating a reference level determined by the voltage drop across PMOS bias transistor 360 under influence of the current through NMOS bias transistor 380. Bias transistors 36, 38 are dimensioned so that the voltage at the reference output REF is higher than the threshold voltage at dummy bit line 194 at which timing circuit 19 cuts off the DEC pulse. Thus, it is ensured that the potential on even the most loaded bit line that is pulled down by a data transistor 100 will have dropped below the reference voltage at the end of the DEC pulse. Outside the first phase, second control PMOS transistor 395 is made conductive to ensure that PMOS bias transistor 360 becomes non-conductive.

It should be appreciated that the invention is not limited to the particular embodiments sense amplifier circuit or the reference circuit shown in the figures. Other, known reference voltage generating circuits may be used. Such a reference circuit could permanently generate a reference voltage and be connected to the reference output via one or more pass transistors similar to pass transistors 20a,b. In this case these pass transistors could be made conductive under control of the DEC pulse for example. Similarly, other amplifiers could be used that are initialized to a balanced state prior to sensing and activated after the connection between the selected bit line and the bit line segment BL has been severed and the reference output REF also has become floating.

Similarly, it should be realized that other types of ROM matrix may be used, for example data transistors may be present at all cross points between word lines and bit lines, but only selected ones may be connected to the bit lines, for example by fuse blowing or mask programming. Similarly a ROM matrix may be used in which the data transistors are all coupled to the bit lines, but only some are coupled to the word lines. Such a coupling may be mediated by a floating gate. Similarly, ROMs using any way of programming may be used, such as for example late programmable ROM's (metal), ROMs that are programmed by adding contact holes or not etc.

The invention claimed is:

1. An integrated circuit device, comprising
a read only memory matrix, comprising cells organized in columns with associated bit lines and rows with associated word lines, the matrix comprising data transistors coupled to both the bit lines and the word lines in data dependent ones of the cells;

a differential sense amplifier having a first input, a second input, and a control input for controlling activation and deactivation of amplification by the sense amplifier;

a coupling circuit coupled between the bit lines and the first input, for controllably permitting charge sharing between a selectable one of the bit lines and the first input;

a reference circuit coupled to the second input and arranged to controllably activate driving of a reference voltage at the second input;

a timing circuit arranged to signal operation in a first phase, when the word lines have selected a row of the matrix, followed by a second phase, the timing circuit controlling the coupling circuit to permit charge sharing between the input and the selectable one of the bit lines in the first phase, and the timing circuit in the second phase controlling the coupling circuit to prevent said charge sharing, making the reference circuit deactivate driving the reference voltage, and activating amplification by the differential sense amplifier only when said charge sharing has been prevented and said driving has been deactivated.

2. An integrated circuit device according to claim 1, wherein the timing circuit comprises
   a dummy bit line capacitively loaded substantially as capacitive loading of a hypothetical bit line with a maximum number of data transistors coupled to that hypothetical bit line;
   a dummy data transistor coupled to the dummy bit line;
   a trigger circuit for triggering the second phase, the trigger circuit activating the dummy data transistor in the first phase and staffing the second phase when a potential swing on the dummy bit line due to activation of the dummy data transistor in the first phase exceeds a threshold value larger than a potential swing that is needed on the bit line to cross the reference voltage.

3. An integrated circuit device according to claim 1, wherein the differential sense amplifier is connected between a first and second power supply connection, the sense amplifier comprising a first and second switching circuit coupled between the sense amplifier and the first and second power supply connection respectively, the timing circuit deactivating and activating amplification by the sense amplifier by making both switching circuits non-conductive and conductive respectively.

4. An integrated circuit device according to claim 3, wherein the differential sense amplifier comprises a pair of inverters, with inputs coupled to the first and second input respectively and outputs cross coupled to each others inputs, the inverters receiving power supply from the power supply connections via the first and second switching circuit.

5. An integrated circuit device according to claim 4, comprising a latch circuit having inputs coupled to the outputs of the inverters.

6. An integrated circuit device according to claim 1, wherein the reference circuit comprises a controllable equalization circuit coupled between the first and second input and arranged to equalize potentials on said first and second input prior to said first phase.

7. An integrated circuit device according to claim 1, wherein the reference circuit comprises a PMOS bias transistor and an NMOS bias transistor with a main current channel coupled from the second input to a negative and a positive power supply terminal respectively, the timing circuit being arranged to drive the control electrodes of the PMOS bias transistor and the NMOS bias transistor to the potential of the negative and positive power supply terminal respectively during said first phase.

8. An integrated circuit device according to claim 1, wherein the reference circuit comprises an first bias transistor and a second bias transistor of mutually opposite polarity with a main current channel coupled to respective power supply terminals, the timing circuit being arranged to switch the main current channel of the first bias transistor to a conductive state and to switch the second bias transistor as a diode during said first phase.

9. An integrated circuit device according to claim 1, wherein the timing circuit comprises
   a dummy bit line with a capacitive load substantially corresponding to a maximum possible capacitive load for any of the bit lines;
   a pull transistor for pulling the potential of the dummy bit line staffing from a the start of the first phase;
   a trigger circuit for triggering the second phase when the potential swing due to said pulling exceeds a threshold value larger than a potential swing that is needed on the bit line to cross the reference voltage.

10. An integrated circuit device according to claim 1, comprising a precharge circuit arranged to precharge the bit lines from a first power supply connection prior to said first phase and to decouple the bit lines from the first power supply connections during said second phase.

11. A method of reading data from a read only memory matrix in an integrated circuit device, the read only memory matrix comprising cells organized in columns with associated bit lines and rows with associated word lines, the matrix comprising data transistors coupled to both the bit lines and the word lines in data dependent ones of the cells;
    providing a differential sense amplifier having a first input a second input and a control input for controlling activation and deactivation of amplification by the sense amplifier;
    providing a coupling circuit coupled between the bit lines and the first input for controllably permitting charge sharing between a selectable one of the bit lines and the first input;
    providing a reference circuit coupled to the second input the method comprising the following steps:
    controllably activating the reference circuit to drive a reference voltage at the second input;
    signalling operation in a first phase, when the word lines have selected a row of the matrix, wherein the coupling circuit is controlled to permit charge sharing between the input and the selectable one of the bit lines, followed by a second phase, wherein the coupling circuit is controlled to prevent said charge sharing, making the reference circuit deactivate driving the reference voltage, and activating amplification by the differential sense amplifier only when said charge sharing has been prevented and said driving has been deactivated.

12. The method of claim 11, further comprising a timing circuit having:
    a dummy bit line capacitively loaded substantially as capacitive loading of a hypothetical bit line with a maximum number of data transistors coupled to that hypothetical bit line
    a dummy data transistor coupled to the dummy bit line
    a trigger circuit for triggering the second phase, the trigger circuit activating the dummy data transistor in the first phase and starting the second phase when a potential swing on the dummy bit line due to activation of the dummy data transistor in the first phase exceeds a threshold value larger than a potential swing that is needed on the bit line to cross the reference voltage.

13. The method of claim 11, wherein the reference circuit is local to a periphery of the memory matrix without containing signal lines that extend in parallel with the bit lines over a column height of the matrix.

14. The method of claim 11, wherein the differential sense amplifier is connected between a first and second power supply connection, the sense amplifier comprising a first and second switching circuit coupled between the sense amplifier and the first and second power supply connection respectively, a timing circuit deactivating and activating amplification by the sense amplifier by making both switching circuits non-conductive and conductive respectively.

15. The method of claim 11, wherein the reference circuit comprises a first bias transistor and a second bias transistor of mutually opposite polarity with a main current channel coupled to respective power supply terminals the timing circuit being arranged to switch the main current channel of the first bias transistor to a conductive state and to switch the second bias transistor as a diode during said first phase.

16. The method of claim 11, further comprising a timing circuit having:
   a dummy bit line with a capacitive load substantially corresponding to a maximum possible capacitive load for any of the bit lines
   a pull transistor for pulling the potential of the dummy bit line staffing from a the start of the first phase;
   a trigger circuit for triggering the second phase when the potential swing due to said pulling exceeds a threshold value larger than a potential swing that is needed on the bit line to cross the reference voltage.

17. The method of claim 11, wherein the reference circuit comprises a controllable equalization circuit coupled between the first and second input and arranged to equalize potentials on said first and second input prior to said first phase.

18. The method of claim 11, wherein the reference circuit comprises a PMOS bias transistor and an NMOS bias transistor with a main current channel coupled from the second input to a negative and a positive power supply terminal respectively, the timing circuit being arranged to drive the control electrodes of the PMOS bias transistor and the NMOS bias transistor to the potential of the negative and positive power supply terminal respectively during said first phase.

19. An integrated circuit device, comprising:
   a read only memory matrix, comprising cells organized in columns with associated bit lines and rows with associated word lines, the matrix comprising data transistors coupled to both the bit lines and the word lines in data dependent ones of the cells;
   a differential sense amplifier, having a first input, a second input, and a control input for controlling activation and deactivation of amplification by the sense amplifier;
   a coupling circuit coupled between the bit lines and the first input, for controllably permitting charge sharing between a selectable one of the bit lines and the first input;
   a reference circuit coupled to the second input, and arranged to controllably activate driving of a reference voltage at the second input;
   a timing circuit arranged to signal operation in a first phase, when the word lines have selected a row of the matrix, followed by a second phase, the timing circuit controlling the coupling circuit to permit charge sharing between the input and the selectable one of the bit lines in the first phase, and the timing circuit in the second phase controlling the coupling circuit to prevent said charge sharing, making the reference circuit deactivate driving the reference voltage, and activating amplification by the differential sense amplifier only when said charge sharing has been prevented and said driving has been deactivated;
   wherein the reference circuit is local to a periphery of the memory matrix without containing signal lines that extend in parallel with the bit lines over a column height of the matrix.

* * * * *